(12) United States Patent
Hirano et al.

(10) Patent No.: US 10,719,015 B2
(45) Date of Patent: Jul. 21, 2020

(54) POSITIVE RESIST FILM LAMINATE AND PATTERN FORMING PROCESS

(71) Applicant: Shin-Etsu Chemical Co., Ltd., Tokyo (JP)

(72) Inventors: Yoshinori Hirano, Annaka (JP); Satoshi Asai, Annaka (JP); Kazunori Kondo, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 93 days.

(21) Appl. No.: 15/950,630

(22) Filed: Apr. 11, 2018

(65) Prior Publication Data

US 2018/0299774 A1 Oct. 18, 2018

(30) Foreign Application Priority Data

Apr. 17, 2017 (JP) .................. 2017-081039

(51) Int. Cl.
| | | |
|---|---|---|
| G03F 7/023 | (2006.01) | |
| G03C 11/12 | (2006.01) | |
| G03F 7/16 | (2006.01) | |
| G03F 7/20 | (2006.01) | |
| C25D 3/02 | (2006.01) | |
| G03F 7/32 | (2006.01) | |
| C08G 8/28 | (2006.01) | |
| C23C 18/16 | (2006.01) | |
| G03F 7/38 | (2006.01) | |
| G03F 7/40 | (2006.01) | |
| G03F 7/022 | (2006.01) | |

(52) U.S. Cl.
CPC ............ *G03F 7/0233* (2013.01); *C08G 8/28* (2013.01); *C23C 18/1601* (2013.01); *C25D 3/02* (2013.01); *G03C 11/12* (2013.01); *G03F 7/022* (2013.01); *G03F 7/023* (2013.01); *G03F 7/0236* (2013.01); *G03F 7/16* (2013.01); *G03F 7/168* (2013.01); *G03F 7/2004* (2013.01); *G03F 7/322* (2013.01); *G03F 7/38* (2013.01); *G03F 7/40* (2013.01)

(58) Field of Classification Search
CPC ...... G03F 7/0226; G03F 7/0233; G03F 7/236; G03F 7/40
See application file for complete search history.

(56) References Cited

U.S. PATENT DOCUMENTS

| | | | | |
|---|---|---|---|---|
| 4,477,553 A | * | 10/1984 | Yamamoto ............... | C08G 8/20 430/190 |
| 4,530,896 A | * | 7/1985 | Christensen ............. | G03C 1/52 430/143 |
| 4,840,869 A | * | 6/1989 | Kita ...................... | C07D 307/79 430/175 |
| 6,461,784 B1 | * | 10/2002 | Komine .................. | G03F 7/115 430/162 |

FOREIGN PATENT DOCUMENTS

WO 2005/036268 A1 4/2005

* cited by examiner

*Primary Examiner* — John S Chu
(74) *Attorney, Agent, or Firm* — Westerman, Hattori, Daniels & Adrian, LLP

(57) ABSTRACT

A laminate comprising a thermoplastic film and a positive resist film is provided, the positive resist film comprising (A) a novolak resin-naphthoquinone diazide (NQD) base resin composition, (B) a polyester, and (C) 3-30 wt % of an organic solvent. The resist film may be transferred to a stepped support without forming voids.

8 Claims, 1 Drawing Sheet

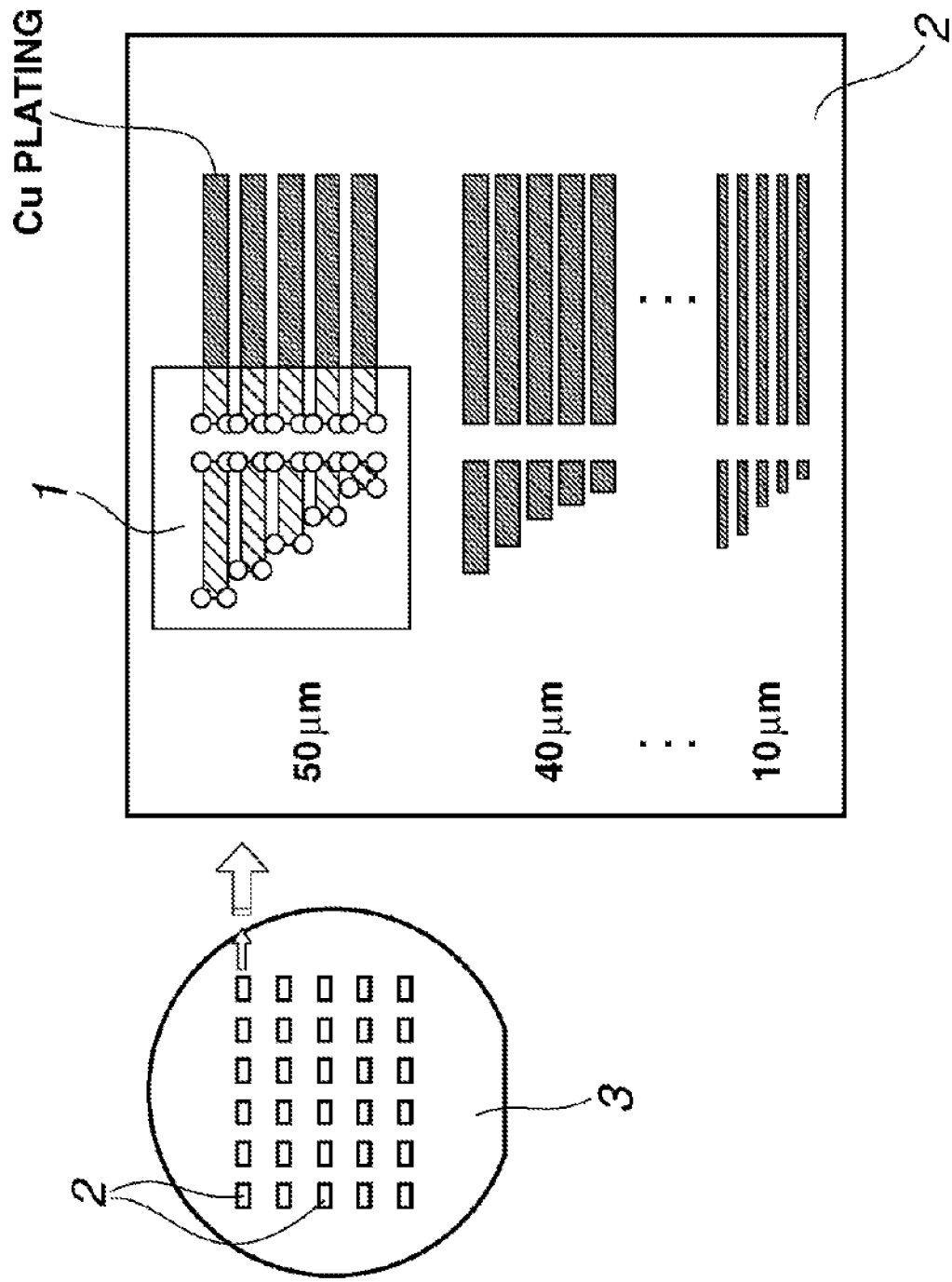

POSITIVE RESIST FILM LAMINATE AND PATTERN FORMING PROCESS

CROSS-REFERENCE TO RELATED APPLICATION

This non-provisional application claims priority under 35 U.S.C. § 119(a) on Patent Application No. 2017-081039 filed in Japan on Apr. 17, 2017, the entire contents of which are hereby incorporated by reference.

TECHNICAL FIELD

This invention relates to a novolak resin-naphthoquinone diazide (NQD) base positive resist film laminate and a pattern forming process.

BACKGROUND ART

As the advanced semiconductor fabrication process uses substrates of larger size, the heat treatment of substrates in an oven is considered. Under the trend, there is pointed out the problem that chemically amplified positive resist materials undergo substantial variations of pattern feature size due to the influence of varying temperature within the oven. Novolak resin-NQD base positive resist materials become attractive since they are relatively insensitive to temperature variations.

In the semiconductor fabrication process, a resist material is generally used to form a resist film on a support such as film, sheet, metal substrate or ceramic substrate. Since the surface of the support has been stepped as a result of circuit formation, the resist material which is used in later steps of the semiconductor fabrication process is required to form a uniform coating free of voids or defects on the stepped surface. When a liquid resist material is coated onto the stepped or uneven surface of a support, it is difficult to form a coating of uniform thickness. Voids are likely to form near steps. The liquid resist material is difficult to meet the requirement whereas a resist film is adequate for the purpose.

Only a few documents refer to positive tone resist films. Patent Document 1 discloses a dry film resist which is mainly intended for scum control, but insufficient to suppress void formation on a stepped support. Since the dry film resist is short of flexibility, it fails to fully conform to steps on the support surface. There is a strong desire for a positive resist film laminate which eliminates void formation when transferred to a stepped support.

CITATION LIST

Patent Document 1: WO 2005/036268

SUMMARY OF INVENTION

An object of the invention is to provide a positive resist film laminate which ensures that a positive resist film is transferred to a stepped support without forming voids, and a pattern forming process.

The inventors have found that the above and other objects are attained by a positive resist film laminate comprising a thermoplastic film and a novolak resin-NQD base positive resist film thereon.

In one aspect, the invention provides a positive resist film laminate comprising a thermoplastic film as a first support and a novolak resin-naphthoquinone diazide (NQD) base positive resist film thereon. The novolak resin-NQD base positive resist film comprises (A) a novolak resin-NQD base resin composition, (B) a polyester, and (C) 3 to 30% by weight of an organic solvent, the novolak resin-NQD base resin composition (A) comprising (A-1) a novolak resin having phenolic hydroxyl groups wherein some or all hydrogen atoms of the phenolic hydroxyl groups are substituted by 1,2-naphthoquinone diazidosulfonyl groups, (A-2) a novolak resin having phenolic hydroxyl groups wherein some or all hydrogen atoms of the phenolic hydroxyl groups are substituted by 1,2-naphthoquinone diazidosulfonyl groups, and a novolak resin having unsubstituted phenolic hydroxyl groups, (A-3) a novolak resin having phenolic hydroxyl groups wherein some or all hydrogen atoms of the phenolic hydroxyl groups are substituted by 1,2-naphthoquinone diazidosulfonyl groups, and a 1,2-naphthoquinone diazidosulfonic acid ester, (A-4) a novolak resin having phenolic hydroxyl groups wherein some or all hydrogen atoms of the phenolic hydroxyl groups are substituted by 1,2-naphthoquinone diazidosulfonyl groups, a novolak resin having unsubstituted phenolic hydroxyl groups, and a 1,2-naphthoquinone diazidosulfonic acid ester, or (A-5) a novolak resin having unsubstituted phenolic hydroxyl groups and a 1,2-naphthoquinone diazidosulfonic acid ester.

Preferably, the polyester (B) is a polyester based on a polyfunctional carboxylic acid having 2 to 6 carboxyl groups.

In another aspect, the invention provides a pattern forming process comprising the steps of:

(1) transferring the novolak resin-NQD base positive resist film of the positive resist film laminate to a second support, (2) exposing the resist film to UV radiation, and (3) developing the resist film in an alkaline aqueous solution.

Preferably, the step (1) may further include pre-baking the resist film after the transfer, and the step (2) may further include post-exposure baking.

The process may further comprise the step (4) of forming a metal plating layer on the second support by electroplating or electroless plating, subsequent to the step (3).

Advantageous Effects of Invention

The novolak resin-NQD base positive resist film laminate of the invention ensures that the positive resist film is transferred to a stepped support without forming voids.

BRIEF DESCRIPTION OF DRAWINGS

FIG. 1 illustrates resist patterns, depicting an area where cracks are observed in Example 10.

DESCRIPTION OF EMBODIMENTS

The abbreviations and acronyms have the following meaning.
UV: ultraviolet radiation
EB: election beam
Mw: weight average molecular weight
PEB: post-exposure baking
NQD: naphthoquinone diazide.

Positive Resist Film Laminate

The novolak resin-NQD base positive resist film laminate is defined as comprising a thermoplastic film as a first support and a novolak resin-NQD base positive resist film thereon which can be transferred to a second support.

Thermoplastic Film

The thermoplastic film serves as a first support or parting substrate and is not particularly limited as long as it does not adversely affect the shape or morphology of the resist film and can be separated from the resist film. The thermoplastic film may be a monolayer film in the form of a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-resin film, special polyvinyl alcohol (PVA) film, and polyester film which is treated with a parting agent.

Among others, PET and PP films are preferred as the first support because of appropriate flexibility, mechanical strength and heat resistance. The films may have been subjected to various treatments such as corona treatment and coating of parting agent. Useful films are commercially available, for example, Cerapeel WZ(RX) and Cerapeel BX8(R) from Toray Advanced Film Co., Ltd., E7302 and E7304 from Toyobo Co., Ltd., Purex G31 and Purex G71T1 from Dupont-Teijin Film Co., Ltd., PET38×1–A3, PET38×1–V8 and PET38×1–X08 from Nippa Corp. As used herein, the term "thermoplastic" means the nature that the film is flexible at normal temperature and pressure and does not crack even when deformed.

Novolak Resin-NQD Base Positive Resist Film

The novolak resin-NQD base positive resist film is defined as comprising (A) a novolak resin-NQD base resin composition, (B) a polyester, and (C) 3 to 30% by weight of an organic solvent.

(A) Novolak Resin-NQD Base Resin Compositor

The novolak resin-NQD base resin composition on which the positive resist film is based contains one of the following components (A-1) to (A-5).

(A-1) a novolak resin having phenolic hydroxyl groups wherein some or all hydrogen atoms of the phenolic hydroxyl groups are substituted by 1,2-naphthoquinone diazidosulfonyl groups, (A-2) a novolak resin having phenolic hydroxyl groups wherein some or all hydrogen atoms of the phenolic hydroxyl groups are substituted by 1,2-naphthoquinone diazidosulfonyl groups, and a novolak resin having unsubstituted phenolic hydroxyl groups, (A-3) a novolak resin having phenolic hydroxyl groups wherein some or all hydrogen atoms of the phenolic hydroxyl groups are substituted by 1,2-naphthoquinone diazidosulfonyl groups, and a 1,2-napthoquinone diazidosulfonic acid ester, (A-4) a novolak resin having phenolic hydroxyl groups wherein some or all hydrogen atoms of the phenolic hydroxyl groups are substituted by 1,2-naphthoquinone diazidosulfonyl groups, a novolak resin having unsubstituted phenolic hydroxyl groups, and a 1,2-naphthoquinone diazidosulfonic acid ester, and (A-5) a novolak resin having unsubstituted phenolic hydroxyl groups and a 1,2-naphthoquinone diazidosulfonic acid ester.

The novolak resin may be prepared by polycondensation reaction of a phenol with an aldehyde in the presence of an acidic catalyst in a well-known manner. Suitable acidic catalysts include hydrochloric acid, sulfuric acid, formic acid, oxalic acid, and p-toluenesulfonic acid. The condensation product may be used as such or after a low-molecular-weight fraction is cut off by post-treatment such as fractionation.

Suitable phenols include phenol; m-cresol, o-cresol, p-cresol, xylenols such as 2,3-xylenol, 2,5-xylenol, 3,5-xylenol, 3,4-xylenol; alkylphenols such as m-ethylphenol, p-ethylphenol, o-ethylphenol, 2,3,5-trimethylphenol, 2,3,5-triethylphenol, 4-tert-butylphenol, 3-tert-butylphenol, 2-tert-butylphenol, 2-tert-butyl-4-methylphenol, 2-tert-butyl-5-methylphenol, 6-tert-butyl-3-methylphenol; alkoxyphenols such as p-methoxyphenol, m-methoxyphenol, p-ethoxyphenol, m-ethoxyphenol, p-propoxyphenol, m-propoxyphenol; isopropenylphenols such as o-isopropenylphenol, p-isopropenylpheno, 2-methyl-4-isopropenylphenol, 2-ethyl-4-isopropenylphenol; polyhydroxyphenols such as 4,4'-dihydroxybiphenyl, bisphenol A, phenylphenol, resorcinol, hydroquinone, pyrogallol; and hydroxynapthalenes such as α-naphthol, β-naphthol, dihydroxynaphthalene. These phenols may be used alone or in admixture. Inter alia, phenol, o-cresol, m-cresol, p-cresol, 2,3-xylenol, 2,5-xylenol, and 3,5-xylenol are preferred as the reactant, with m-cresol and p-cresol being most preferred.

If desired, phenols having an allyl group may be used as the reactant. Suitable allyl-containing phenols include 2-allylphenol, 4-allylphenol, 6-methyl-2-allylphenol, and 4-allyl-2-methoxyphenol, with 2-allylphenol being preferred. The allyl-containing phenol may be used in an amount of 0 to 40% by weight of the entire phenols used to produce the novolak resin.

Suitable aldehydes include formaldehyde, paraformaldehyde, trioxane, acetaldehyde, propionaldehyde, butylaldehyde, trimethylacetaldehyde, acrolein, crotonaldehyde, cyclohexanaldehyde, furfural, furylacrolein, benzaldehyde, terephthalaldehyde, phenylacetaldehyde, α-phenylpropylaldehyde, β-phenylpropylaldehyde, o-hydroxybenzaldehyde, m-hydroxybenzaldehyde, p-hydroxybenzaldehyde, o-methylbenzaldehyde, m-methylbenzaldehyde, p-methylbenzaldehyde, o-chlorobenzaldehyde, m-chlorobenzaldehyde, and p-chlorobenzaldehyde. These aldehydes may be used alone or in admixture. Inter alia, formaldehyde is most preferred for availability.

The novolak resin is preferably obtained using p-cresol in an amount of at least 40 mol %, more preferably at least 45 mol % of the phenol reactants. The maximum amount of p-cresol used is 100 mol % of the phenol reactant. When another phenol is used in combination with p-cresol, the maximum amount of p-cresol is preferably 80 mol %, more preferably 70 mol % of the phenol reactants. Suitable examples of the other phenol to be combined with p-cresol include m-cresol, 2,5-xylenol, and 3,5-xylenol, with m-cresol being most preferred.

The novolak resin should preferably have a weight average molecular weight (Mw) of 2,000 to 50,000, more preferably 3,000 to 20,000, as measured by gel permeation chromatography (GPC) versus polystyrene standards.

The novolak resins may be used alone or in admixture of two or more.

The novolak resin has phenolic hydroxyl groups which may be esterified with 1,2-naphthoquinonediazidosulfonic acid halide by the well-known method (e.g., JP-A H06-242602 or U.S. Pat. No. 5,422,221).

Suitable 1,2-naphthoquinonediazidosulfonic acid halides include 1,2-naphthoquinone-2-diazido-5-sulfonyl chloride, 1,2-naphthoquinone-2-diazido-4-sulfonyl chloride, and 1,2-naphthoquinone-2-diazido-5-sulfonyl bromide. Inter alia, 1,2-naphthoquinone-2-diazido-5-sulfonyl chloride and 1,2-naphthoquinone-2-diazido-4-sulfonyl chloride are preferred.

When phenolic hydroxyl groups on the novolak resin are esterified with 1,2-naphthoquinonediazidosulfonic acid halide, preferably at least 2 mol % of the phenolic hydroxyl groups are esterified. The maximum proportion of phenolic hydroxyl groups to be esterified is not particularly limited, but preferably about 20 mol %, more preferably about 10 mol %.

If desired, some or all non-esterified phenolic hydroxyl groups may be acylated in order to control the hydrophilicity of the novolak resin to alkaline developer. The acylation reaction may resort to any well-known techniques. For example, the novolak resin is reacted with benzoyl chloride, acetyl chloride or propionyl chloride in the presence of a basic catalyst, yielding an acylated novolak resin.

Exemplary of the 1,2-naphthoquinonediazidosulfonic acid ester is a compound having two or more hydroxyl groups and two or more aromatic rings wherein one or more or all hydrogen atoms of the hydroxyl groups are substituted by 1,2-naphthoquinonediazidosulfonyl groups. Examples of the compound having two or more hydroxyl groups and two or more aromatic rings include benzophenone compounds having a plurality of hydroxyl groups such as trihydroxybenzophenone and tetrahydroxybenzophenone, and compounds having the following formulae (1) and (2).

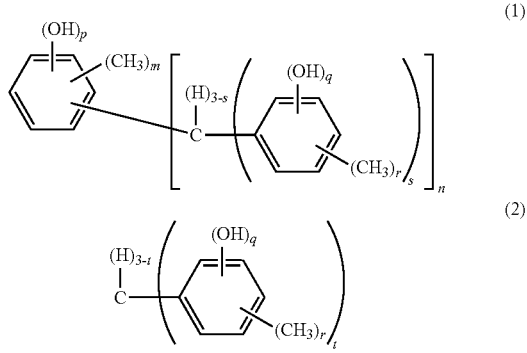

Herein m, p and r are each independently an integer of 0 to 3, n is an integer of 1 to 4, q is an integer of 1 to 3, s is 1 or 2, t is 2 or 3, $1 \leq m+p+n \leq 6$ and $1 \leq q+r \leq 5$.

Examples of the trihydroxybenzophenone include 2,3,4-trihydroxybenzophenone, 2,4,5-trihydroxybenzophenone, 2,4,6-trihydroxybenzophenone, 2,2',4-trihydroxybenzophenone, 2,2',5-trihydroxybenzophenone, 2,3,4'-trihydroxybenzophenone, 2,4,4'-trihydroxybenzophenone and 2,4',5-trihydroxybenzophenone. Examples of the tetrahydroxybenzophenone include 2,3,4,4'-tetrahydroxybenzophenone, 2,2',4,4'-tetrahydroxybenzophenone, 2,2',3,4-tetrahydroxybenzophenone, 2,2',4,5-tetrahydroxybenzophenone, 2,3',4,4'-tetrahydroxybenzophenone, 2,3',4,6-tetrahydroxybenzophenone, 2,6,3',5'-tetxahydroxybenzophenone, and 3,4,5,3'-tetrahydroxybenzophenone.

Examples of the 1,2-naphthoquinonediazidosulfonic acid include 1,2-naphthoquinone-2-diazido-5-sulfonic acid, 1,2-naphthoquinone-2-diazido-4-sulfonic acid, and 1,2-naphthoquininone-2-diazido-6-sulfonic acid. Inter alia, 1,2-naphthoquinone-2-diazido-5-sulfonic acid and 1,2-naphthoquinone-2-diazido-4-sulfonic acid are preferred.

As mentioned above, the 1,2-naphthoquinonediazidosulfonic acid ester is typically a compound having hydroxyl groups wherein one or more or all hydrogen atoms of the hydroxyl groups are substituted by 1,2-naphthoquinonediazidosulfonyl groups. Preferably at least 30 mol %, more preferably at least 50 mol % of the hydrogen atoms of the hydroxyl groups are substituted by 1,2-naphthoquinonediazidosulfonyl groups.

If desired, unreacted hydroxyl groups on the 1,2-naphthoquinonediazidosulfonic acid ester may also be acylated. The acylation reaction may resort to any well-known techniques.

When the 1,2-naphthoquinonediazidosulfonic acid ester is added, its amount is preferably 1 to 55 parts by weight, more preferably 10 to 50 parts by weight, and most preferably 20 to 45 parts by weight per 100 parts by weight of the novolak resin in component (A). The 1,2-naphthoquinonediazidosulfonic acid esters may be used alone or in admixture of two or more while commercially available products thereof may be used.

(B) Polyester

The polyester as component (B) is the condensate of a polyfunctional carboxylic acid with a polyhydric alcohol or the condensate of a polyfunctional caxboxylic anhydride with a polyhydric alcohol.

The polyfunctional carboxylic acids are preferably those having 2 to 6 carboxyl groups. Examples include oxalic acid, succinic acid, malonic acid, glutaric acid, adipic acid, pimelic acid, suberic acid, azelaic acid, sebacic acid, brassilic acid, methylmalonic acid, citraconic acid, fumaric acid, maleic acid, methylmaleic acid, mesaconic acid, glutaconic acid, itaconic acid, allylmalonic acid, teraconic acid, muconic acid, butynedioic acid, aconitic acid, malic acid, tartaric acid, racemic acid, citric acid, oxomalonic acid, oxosuccinic acid, thiomalic acid, glutamic acid, ethylene diamine tetraacetic acid, 1,2-yclopropanedicarboxylic acid, truxillic acid, camphoric acid, phthalic acid, isophthalic acid, terephthalic acid, phenylsuccinic acid, 2-(3-carboxyphenyl)-2-oxoacetic acid, meconic acid, and cyclobutanedicarboxylic acid. Anhydrides of the foregoing acids are also useful. Of these, difunctional carboxylic acids are preferred. The polyfunctional carboxylic acids may be used alone or in admixture.

Suitable polyhydric alcohols include 1,2-propanediol, 1,3-propanediol, 1,2-utanediol, 1,3-butanediol, 3-methyl-1,3-butanediol, 1,4-butanediol, 1,4-yclohexanemethanediol, 1,2-pentanediol, 1,3-pentanediol, 1,5-pentanediol, 1,6-exanediol, 2-methyl-2,4-pentanediol, 3-methyl-1,5-pentanediol, ethylene glycol, propylene glycol, neopentyl glycol, glycerol, and pentaglycerol. Of these, dihydric alcohols are preferred. The polyhydric alcohols may be used alone or in admixture.

Condensation polymerization of these reactants may be carried out by a well-known method, yielding the polyester. The amounts of reactants may be adjusted in accordance with the desired molecular weight of the resulting polymer. Typically, about 0.5 to 3 moles of the polyhydric alcohol is used per mole of the polyfunctional carboxylic acid.

Esterification may accord with a well-known method. Typically condensation reaction may be performed by using an acidic catalyst such as sulfuric acid and a metal compound such as a titanium, tin, zinc, germanium or antimony compound, and optionally heating at a temperature of about 150 to 300° C.

Since component (B) is one constituent of the positive resist film, it is preferably alkali soluble, especially soluble in tetramethylammionium hydroxide (TMAH) aqueous solution.

The polyester (B) preferably has a Mw of 700 to 50,000, more preferably 1,500 to 45,000. A Mw in the range is preferable because the risk of film thickness loss in the unexposed region during development is eliminated and the development rate is satisfactory.

The amount of the polyester (B) used is preferably 5 to 100 parts by weight, more preferably 10 to 60 parts by weight, and even more preferably 15 to 50 parts by weight per 100 parts by weight of the novolak resin in component (A). An amount in the range eliminates both the risk of void formation upon transfer to another support and the risk of film thickness loss in the unexposed region during development. The polyesters may be used alone or in admixture as component (B).

(C) Organic Solvent

The organic solvent as component (C) is not particularly limited as long as it has a sufficient solubility relative to other components and a film-forming ability. Suitable organic solvents include cellosolve solvents such as methyl cellosolve, ethyl cellosolve, methyl cellosolve acetate, and ethyl cellosolve acetate: propylene glycol solvents such as propylene glycol and dipropylene glycol; propylene glycol alkyl ether solvents such as propylene glycol monomethyl ether and propylene glycol monobutyl ether; propylene glycol alkyl ether acetate solvents such as propylene glycol monomethyl ether acetate (PGMEA), propylene glycol dimethyl ether, and propylene glycol monoethyl ether acetate; ester solvents such as butyl acetate, pentyl acetate, methyl lactate, ethyl lactate, ethyl 3-methoxypropionate, and ethyl 3-ethoxypropionate; alcohol solvents such as methanol, ethanol, isopropanol, butanol, hexanol and diacetone alcohol; ketone solvents such as acetone, cyclohexanone, cyclopentanone, methyl ethyl ketone, methyl pentyl ketone and methyl isobutyl ketone; ether solvents such as methyl phenyl ether and diethylene glycol dimethyl ether; highly polar solvents such as N,N-dimethylformamide, N-methylpyrrolidone, and dimethyl sulfoxide; and mixtures thereof.

Of these solvents, propylene glycol alkyl ether acetates, alkyl lactates, and alkyl ketones are preferred. The solvents may be used alone or in admixture. It is noted that the alkyl group of the propylene glycol alkyl ether acetate is preferably of 1 to 4 carbon atoms, for example, methyl, ethyl and propyl, with methyl and ethyl being especially preferred. Since the propylene glycol alkyl ether acetates include 1,2- and 1,3-substituted ones, each includes three isomers depending on the combination of substituted positions, which may be used alone or in admixture. Also, the alkyl group of the alkyl lactate is preferably of 1 to 4 carbon atoms, for example, methyl, ethyl and propyl, with methyl and ethyl being especially preferred. The alkyl group of the alkyl ketone is preferably of 1 to 10 carbon atoms, for example, methyl, ethyl, propyl, isobutyl, cyclopentyl and cyclohexyl, with isobutyl, cyclopentyl and cyclohexyl being especially preferred.

The organic solvent (C) is preferably present in an amount of 5 to 30% by weight, more preferably 5 to 25% by weight of the resist film. An organic solvent content in excess of 30% by weight may fail to form a film. A film with an organic solvent content of less than 3% by weight is less flexible and liable to crack. The resist film is characterized in that it retains the organic solvent (C) therein for a duration of at least 2 hours, preferably at least 1 week, and more preferably at least 1 month at normal temperature.

(D) Surfactant

The resist film may further contain (D) a surfactant. Illustrative, non-limiting, examples of the surfactant include nonionic surfactants, for example, polyoxyethylene alkyl ethers such as polyoxyethylene lauryl ether, polyoxyethylene stearyl ether, polyoxyethylene cetyl ether, and polyoxyethylene oleyl ether, polyoxyethylene alkylaryl ethers such as polyoxyethylene octylphenol ether and polyoxyethylene nonylphenol ether, polyoxyethylene polyoxypropylene block copolymers, sorbitan fatty acid esters such as sorbitan monolaurate, sorbitan monopalmitate, and sorbitan monostearate, polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as EFTOP EF301, EF303 and EF352 (Tohkem Products Co., Ltd.), Megaface F171, F172 and F173 (DIC Corp.), Fluorad FC-4430, FC-430 and FC-431 (Sumitomo 3M Co., Ltd.), Smiynol E1004 (Nissin Chemical Industry Co., Ltd.), Asahiguard AG710, Surfion S-381, S-382, SC101, SC102, SC103, SC104, SC105, SC106, KH-10, KH-20, KH-30 and KH-40 (AGC Seimi Chemical Co., Ltd.); organosiloxane polymers KP341, X-70-092 and X-70-093 (Shin-Etsu Chemical Co., Ltd.), acrylic acid or methacrylic acid Polyflow No. 75 and No. 95 (Kyoeisha Ushi Kagaku Kogyo Co., Ltd.). Inter alia, FC-4430, KP-341 and X-70-093 are preferred. These surfactants may be used alone or in admixture.

The surfactant is preferably formulated in an amount of 0 to 5 parts, and more preferably 0.01 to 2 parts by weight per 100 parts by weight of the novolak resin in component (A).

Other Components

In the resist film, other well-known additives may be added as long as they do not compromise the benefits of the invention. Suitable additives include photoacid generators, photobase generators, sensitizers, crosslinkers (e.g., melamine compounds, epoxy compounds), dissolution promoters (e.g., water-soluble cellulose), stress relaxing agents (e.g., polyvinyl alcohol, polyvinyl alkyl ether compounds), dyes (e.g., azo compounds, curcumin), adhesion promoters (e.g., benzotriazole compounds, imidazole compounds), and shape improvers (e.g., oxalic acid).

Preparation of Novolak Resin-NQD Base Positive Resist Film Laminate

It is now described how to prepare the novolak resin-NQD base positive resist film laminate. First, a uniform positive resist solution is prepared by dissolving components (A) and (B), and if necessary, component (D) and other components in the organic solvent (C) all at once or in arbitrary order. If necessary, the solution may be filtered through a filter.

In preparing the positive resist solution, the amount of the organic solvent (C) used is preferably 20 to 400 parts, more preferably 30 to 200 parts by weight per 100 parts by weight of the novolak resin in component (A). As long as the amount of organic solvent is in the range, a film may be formed to a uniform thickness without the risk of forming defects. In the practice of the invention, the desired positive resist film laminate is prepared by once dissolving constituent components in an excess amount of the organic solvent until uniform, followed by coating and drying steps. Thus, the amount of organic solvent used in the step of dissolving constituent components may be adjusted as appropriate depending on the desired thickness of the film.

In a clean room at a cleanness class of up to 1,000, the positive resist solution is coated on a thermoplastic film (or parting substrate) as the first support, rising an applicator installed in a zone which is kept at a temperature of 5 to 45° C., preferably 15 to 35° C. and a humidity of 5 to 90%, preferably 10 to 70%. Suitable applicators include a forward roll coater, reverse roll coater, comma coater, die coater, lip coater, gravure coater, dip coater, air knife coater, capillary coater, raising and rising (R&R) coater, blade coater, bar coater, and extrusion molding machine. The resist solution is coated on a thermoplastic film while the film is preferably fed at a speed of 0.05 to 1,000 m/min, more preferably 0.1 to 500 m/min. After coating of the resist solution, the called film is passed through an in-line dryer or hot air circulating oven at 40 to 130° C. for 1 to 40 minutes, more preferably at 50 to 120° C. for 2 to 30 minutes, until the organic solvent and any volatiles are removed. By drying in this way, a resist film is formed on the thermoplastic film to yield the positive resist film laminate. A resist film may also be formed by infrared irradiation drying instead of the in-line dryer, or by plural drying means such as a combination of the in-line dryer and infrared irradiation drying, to remove the organic solvent. If necessary, a protective film (or another parting substrate) may be press bonded to the resist film laminate on a roll laminator, yielding a protected laminate.

In this way, the resist film may be continuously formed as a length of resist film layer and taken up as a film roll, which is easy to handle. This is also true to the resist film laminate having the protective film formed thereon.

Like the thermoplastic film, the protective film used herein is not particularly limited as long as it does not adversely affect the shape or morphology of the resist film and can be separated from the resist film. The protective film may be a single polymer film or a multilayer film consisting of a plurality of polymer layers. Use may be made of any plastic films including nylon film, polyethylene (PE) film, polyethylene terephthalate (PET) film, polyethylene naphthalate film, polyphenylene sulfide (PPS) film, polypropylene (PP) film, polystyrene film, polymethylpentene (TPX) film, polycarbonate film, fluoro-resin film, special polyvinyl alcohol (PVA) film, and polyester film which has been treated with a parting agent.

Of these, films of PET and PE are preferred because of appropriate flexibility. Commercial available films may be used as well. Useful PET films are as mentioned above, and useful PE films include GF-8 (Tamapoly Co., Ltd.), PE FILM 0 TYPE (Nippa Corp.), Toretec 7332, Toretec 7111 and Toretec 7721 (Toray Advanced Film Co., Ltd.).

The thermoplastic film and the protective film each have a thickness of preferably 10 to 150 μm, more preferably 25 to 100 μm, from the viewpoints of stable film formation and anti-curling from the roll state wound around the windup mandrel.

The novolak resin-NQD base positive resist film is formed on the thermoplastic film such that the resist film may be later transferred to a second support. The resist film has a thickness of preferably 5 to 250 μm, more preferably 10 to 180 μm. The second support is selected from plastic films or sheets, semiconductor substrates of Si, Cu, $SiO_2$, SiN, SiON, TiN, WSi, BPSG and SOG, metal substrates of Au, Ti, W, Cu, Ni—Fe, Ta, Zn, Co and Pb, and organic substrates such as or game antireflective coatings. The second support may have steps or undulation on its surface as a result of circuit formation by plating or sputtering or deposition of dielectric resin. In this case, steps are of the order of preferably 0 to 200 μm, more preferably 3 to 100 μm, even more preferably 10 to 50 μm in height.

On use, the protective film is peeled from the resist film in the laminate constructed as above. The peeling force of the protective film from the resist film is typically in a range of 0.1 to 500 gf/24 mm, when measured by the following method. The test is carried out according to JIS Z0237 "Test method of measuring peel adhesion of release liner from pressure-sensitive adhesive tape surface". The testing environment is under standard conditions (temperature 23±1° C., relative humidity 50±5%). The film piece used in the test has a width of 24 mm. The film width should be constant became the peeling force varies if the film width varies. Once a film piece of the predetermined width is furnished, measurement is carried out on a tester by peeling the protective film at an angle of 180° and a speed of 5.0±0.2 mm/sec. As to the measurement value, measurement values over the initial 25 mm portion are excluded, and an average of measurement values over the succeeding 50 mm portion is reported as the test data.

Pattern Forming Process

The novolak resin-NQD base positive resist film of the resist film laminate may be bonded to a second support, typically semiconductor substrate using a suitable laminator such as vacuum laminator or roll laminator. The thermoplastic film is peeled off, whereby the resist film is transferred to the second support. The support may be of a stepped structure. In this case, the resist film having an appropriate thickness corresponding to the height of steps is used so that the resist film may be buried in steps. The resist film is advantageously applicable to a support having steps of the order of 0 to 200 μm. The transfer step may or may not be followed by heat treatment. When heat treatment is performed, the assembly may be prebaked on a hotplate or in an oven at 60 to 150° C. fox 1 to 30 minutes, preferably at 80 to 130° C. for 1 to 10 minutes.

Next, the resist film is exposed to radiation through a mask having a desired pattern, the radiation being selected from UV, deep UV and EB, preferably radiation with a wavelength of at least 300 nm, more preferably 350 to 500 nm. The exposure dose is preferably in the range of about 10 to 5,000 $mJ/cm^2$, more preferably about 30 to 2,000 $mJ/cm^2$. If desired, the film may be baked (PEB) on a hotplate at 60 to 150° C. for 1 to 10 minutes, preferably at 80 to 120° C. for 1 to 5 minutes.

Thereafter the resist film is developed in a developer in the form of an aqueous alkaline solution, for example, 0.1 to 5 wt %, preferably 2 to 3 wt % aqueous solution of tetramethylammonium hydroxide (TMAH) for 0.1 to 60 minutes, preferably 0.5 to 10 minutes by a conventional technique such as dip, puddle or spray development. In this way, a desired resist pattern is formed on the support or substrate.

After the development step, electroplating or electroless plating may be carried out to form a metal plating layer on the resist pattern-bearing second support or substrate. That is, a metal plating pattern is obtained. The plating step may be any of standard electroplating or electroless plating methods to deposit a conductor pattern, after which the resist pattern is removed.

Suitable electroplating or electroless plating methods include electrolytic Cu plating, electroless Cu plating, electrolytic Ni plating, electroless Ni plating, and electrolytic Au plating. Plating may be performed in any well-known plating baths and under standard conditions. The thickness of a plating layer is typically 80 to 100% of the thickness of the resist pattern. For example, a resist pattern of 1 μm thick is formed on a seed layer of Cu, after which a Cu plating pattern of 0.8 to 1 μm thick is deposited thereon by electrolytic Cu plating.

EXAMPLE

Examples of the invention are given below by way of illustration and not by way of limitation. All parts are by weight (pbw).

1) Synthesis of Photosensitive Novolak Resin

Synthesis Example 1

A flask equipped with a stirrer, nitrogen purging line and thermometer was charged with 120 g of a cresol novolak resin containing 55 mol % of p-cresol units and 45 mol % of m-cresol units, having a melting temperature of 145° C. and a Mw of 4,500 (Asahi Yukrzai Corp.), 8.1 g (3 mol % relative to phenolic hydroxyl groups on the resin) of 1,2-naphthoquinone-2-diazido-5-sulfonyl chloride (Toyo Gosei Co., Ltd.), and 500 g of 1,4-dioxane, which were stirred until uniform. At room temperature, 10.6 g of triethylamine was added dropwise to the solution, followed by 10 hours of stirring. The reaction solution was poured into a large volume of 0.1 mol/L hydrochloric acid aqueous solution, allowing a resin to precipitate. The resin precipitate was collected and dried under reduced pressure, yielding 130 g of the desired photosensitive resin, partially 1,2-naphthoquinone-2-diazido-5-sulfonylated photosensitive novolak resin 1 (PAP1).

Synthesis Example 2

By the same procedure as in Synthesis Example 1, 120 g of a cresol novolak resin containing 45 mol % of p-cresol units and 55 mol % of m-cresol units, having a melting temperature of 143° C. and a Mw of 6,000 (Asahi Yukizai Corp.) was reacted with 32.2 g (12 mol % relative to phenolic hydroxyl groups on the resin) of 1,2-naphthoquinone-2-diazido-5-sulfonyl chloride (Toyo Gosei Co., Ltd.) to produce photosensitive novolak resin 2 (PAP2).

2) Preparation of Novolak Resin-NQD Base Positive Resist Film Laminate

Examples 1 to 9 and Comparative Examples 1 to 5

Resist solutions, designated RS1 to RS13, were prepared by dissolving components (A), (B), (D) and other components in the organic solvent (C) in accordance with the formulation shown in Table 1 and filtering through a membrane filter having a pore size of 1.0 μm. The components in Table 1 are identified below.

(A) Novolak Resin-NQD Base Resin Composition
  PAP1: photosensitive novolak resin in Synthesis Example 1
  PAP2: photosensitive novolak resin in Synthesis Example 2
  EP: EP6050G (cresol novolak resin by Asahi Yukizai Corp.)
  NT: NT-200 (1,2-naphthoquinonediazidosulfonic acid ester by Toyo Gosei Co., Ltd.)
(B) Polyester
  PE1: Polycizer W-230-H (adipic acid base polyester, Mw=1,000, DIC Corp.)
  PE2: Polycizer W-2050 (adipic acid base polyester, Mw=3,900, DIC Corp.)
  PE3: ADK Cizer P-300 (adipic acid base polyester, Mw=4,900, Adeka Corp.)
  PE4: D645 (adipic acid base polyester, Mw=5,600, J-Plus Co., Ltd.)
(C) Organic Solvent
  EL: ethyl lactate
  CP: cyclopentanone
  PMA: propylene glycol monomethyl ether acetate
(D) Surfactant
  SF1: X-70-093 by Shin-Etsu Chemical Co., Ltd.
  SF2: KP-341 by Shin-Etsu Chemical Co., Ltd.
Other Components
  OA: oxalic acid
  BTA: benzotriazole
  M40: polyvinyl methyl ether Lutonal M40 by BASF AG
  UC: acrylic resin UC-3510 by Toa Gosei Co., Ltd.

TABLE 1

| Resist solution | Component A (pbw) | Component B (pbw) | Component C (pbw) | Component D (pbw) | Other Component (pbw) |
|---|---|---|---|---|---|
| RS1 | PAP1 (100) | PE2 (15) | EL (150) | SF1 (0.05) | — |
| RS2 | PAP2 (100) | PE3 (30) | EL (75) PMA (75) | SF2 (0.03) | — |
| RS3 | PAP2 (80) EP (20) | PE4 (35) | EL (100) CP (50) | SF1 (0.10) | — |
| RS4 | EP (70) NT (30) | PE1 (20) | PMA (50) CP (100) | SF2 (0.05) | — |
| RS5 | PAP1 (90) EP (10) | PE2 (15) | PMA (150) | SF2 (0.10) | — |
| RS6 | PAP1 (90) NT (10) | PE3 (10) | CP (150) | SF1 (0.03) | — |
| RS7 | EP (85) NT (15) | PE4 (5) | EL (50) CP (100) | SF2 (0.05) | — |
| RS8 | PAP2 (95) NT (5) | PE4 (40) | EL (100) PMA (50) | SF2 (0.15) | OA (0.01) |
| RS9 | PAP1 (100) | PE1 (10) | PMA (75) CP (75) | SF1 (0.15) | BTA (0.05) |
| RS10 | PAP1 (100) | — | PMA (150) | SF1 (0.05) | — |
| RS11 | EP (80) NT (20) | — | EL (100) CP (50) | SF1 (0.10) | — |
| RS12 | PAP2 (100) | — | EL (75) PMA (75) | SF2 (0.05) | M40 (30) |
| RS13 | PAP1 (90) EP (10) | — | PMA (75) CP (75) | SF2 (0.03) | UC (40) |

In a clean room at a cleanness class of 1,000, a temperature of 22-26° C. and a humidity of 40-45%, the resist solution (RS1 to RS13) was coated onto a PET film of 38 μm thick as the thermoplastic film by means of a die coater as the film coater, and dried in a hot air circulating oven at the temperature shown in Table 2 for 5 minutes, yielding a laminate (L1 to L13) having a positive resist film of 20 μm thick.

A PF film of 50 μm thick as the protective film was bonded to the surface of the positive resist film under a pressure of 1 MPa. A content of organic solvent in the positive resist film was determined by sampling a 0.1 g portion of the positive resist film from the film laminate, extraction with 10 ml of acetomtrile, centrifugation, collecting the supernatant, and gas chromatography analysis. The resist film in Examples retained the organic solvent in the amount (wt %) shown in Table 2 during holding at 23° C. for 7 days.

TABLE 2

| | Resist solution | Oven temperature (° C.) | Residual solvent (%) |
|---|---|---|---|
| Example 1 | RS1 | 90 | 18 |
| Example 2 | RS2 | 110 | 7 |
| Example 3 | RS3 | 105 | 8 |
| Example 4 | RS4 | 95 | 15 |
| Example 5 | RS5 | 80 | 25 |
| Example 6 | RS6 | 85 | 22 |
| Example 7 | RS7 | 100 | 11 |
| Example 8 | RS8 | 110 | 5 |
| Example 9 | RS9 | 75 | 22 |
| Comparative Example 1 | RS10 | 65 | 35 |
| Comparative Example 2 | RS11 | 90 | 13 |
| Comparative Example 3 | RS12 | 80 | 20 |
| Comparative Example 4 | RS13 | 100 | 15 |
| Comparative Example 5 | RS1 | 140 | 1 |

3) Evaluation of Void Formation

The protective film was peeled from the positive resist film laminate. Using a vacuum laminator (TEAM-300 M, Takatori Co., Ltd.) whose vacuum chamber was set at a vacuum of 80 Pa, the resist film on the thermoplastic film was transferred to a Cu substrate of diameter 390 mm having steps of 50 μm at the maximum. The temperature was 60° C. With the chamber restored to atmospheric pressure, the substrate was taken out of the laminator, and the thermoplastic film was peeled off. The resist film-bearing substrate was observed under an optical microscope (by Nikon Corp.) to inspect any bubbles on the substrate. For each of Examples and Comparative Examples, the test was performed 5 times, and an average was calculated and used for judgment. The film was judged good (O) for no bubbles, mediocre (Δ) for 1 to 10 bubbles on the average, and poor (X) for 11 or more bubbles on the average. The results are shown in Table 3.

TABLE 3

| | Bubble formation |
|---|---|
| Example 1 | O |
| Example 2 | O |
| Example 3 | O |
| Example 4 | O |
| Example 5 | O |
| Example 6 | O |
| Example 7 | O |
| Example 8 | O |
| Example 9 | O |

TABLE 3-continued

| | Bubble formation |
|---|---|
| Comparative Example 1 | film could not be formed |
| Comparative Example 2 | X |
| Comparative Example 3 | Δ |
| Comparative Example 4 | Δ |
| Comparative Example 5 | X |

The positive resist film laminates of Examples 1 to 9 were evaluated for void formation by the same procedure as above except that a silicon substrate of diameter 200 mm having a 5-μm L/S pattern of Cu plating was used instead of the Cu substrate. The positive resist films of Examples 1 to 9 caused no bubbles.

4) Pattern Forming Test

Example 10

A positive resist film laminate was prepared by the same method of preparing film laminates as above, aside from rising resist solution RS9, setting an oven temperature of 100° C., and adjusting to a residual solvent content of 12%. The resist film was transferred from the resist film laminate to a Cu substrate of diameter 200 mm and soft-baked on a hotplate at 100° C. for 1 minute. The resist film as soft-baked had a thickness of 18 μm as measured by an optical interference film thickness measurement system (M6100 by Nanometrics Inc.). Using an i-line stepper (NSR-2205i11D by Nikon Corp.), the resist film was exposed through a reticle, baked (PEB) at 110° C. for 90 seconds, puddle developed in a 2.38 wt % TMAH aqueous solution for 150 seconds, rinsed with pure water, and dried.

The resulting pattern was observed under a scanning electron microscope (S-4700 by Hitachi High-Technologies Corp.), finding that a 20 μm line-and-space iteration pattern of a rectangular profile was resolved in an exposure dose of 200 mJ/cm$^2$.

After the pattern formation, the surface of the resist pattern-bearing substrate was treated with an oxygen plasma by operating a dry etching system (DEM-451, Nichiden Anelva Co., Ltd.) at 100 W for 30 seconds, to effect ashing. The substrate was immersed in a copper plating bath (Microfab Cu200, Tanaka Precious Metals K.K.), where electroplating of copper was carried out by a constant current flow at 25° C. for 5 minutes, depositing a copper layer of about 5 μm thick. After plating, the surface was washed with flowing deionized water. The resist surface was observed under an optical microscope. The resist film was examined for deformation and cracking by growth stress of plating. With respect to crack resistance, 900 points or crack-sensitive corners on a resist pattern as shown in FIG. 1 were inspected. No cracks were found, indicating that the sample had plating resistance. In FIG. 1, 1 designates a crack inspecting area which includes 6×5=30 points for a size of 50 μm within one shot, indicating that on the entire wafer surface (30 shots, shown left), 30×30=900 points were inspected; 2 is an enlarged view of pattern features; and 3 is a plan view of the entire wafer.

Japanese Patent Application No. 2017-081039 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A positive resist film laminate comprising a thermoplastic film as a first support and a novolak resin-naphthoquinone diazide (NQD) base positive resist film thereon,
said novolak resin-NQD base positive resist film comprising
(A) a novolak resin-NQD base resin composition,
(B) a polyester, and
(C) 3 to 30% by weight of an organic solvent,
the novolak resin-NQD base resin composition (A) comprising
(A-1) a novolak resin having phenolic hydroxyl groups wherein some or all hydrogen atoms of the phenolic hydroxyl groups are substituted by 1,2-naphthoquinone diazidosulfonyl groups,
(A-2) a novolak resin having phenolic hydroxyl groups wherein some or all hydrogen atoms of the phenolic hydroxyl groups are substituted by 1,2-naphthoquinone diazidosulfonyl groups, and a novolak resin having unsubstituted phenolic hydroxyl groups,
(A-3) a novolak resin having phenolic hydroxyl groups wherein some or all hydrogen atoms of the phenolic hydroxyl groups are substituted by 1,2-naphthoquinone diazidosulfonyl groups, and a 1,2-naphthoquinone diazidosulfonic acid ester,
(A-4) a novolak resin having phenolic hydroxyl groups wherein some or all hydrogen atoms of the phenolic hydroxyl groups are substituted by 1,2-naphthoquinone diazidosulfonyl groups, a novolak resin having unsubstituted phenolic hydroxyl groups, and a 1,2-naphthoquinone diazidosulfonic acid ester, or
(A-5) a novolak resin having unsubstituted phenolic hydroxyl groups and a 1,2-naphthoquinone diazidosulfonic acid ester,
wherein the polyester (B) is a condensate of a polyfunctional carboxylic acid with a polyhydric alcohol or a condensate of a polyfunctional carboxylic anhydride with a polyhydric alcohol.

2. The laminate of claim 1 wherein the polyester (B) is a polyester based on a polyfunctional carboxylic acid having 2 to 6 carboxyl groups.

3. A pattern forming process comprising the steps of:
(1) transferring the novolak resin-NQD base positive resist film of the laminate of claim 1 to a second support,
(2) exposing the resist film to UV radiation, and
(3) developing the resist film in an alkaline aqueous solution.

4. The process of claim 3 wherein the step (1) further includes pre-baking the resist film after the transfer.

5. The process of claim 3 wherein the step (2) further includes post-exposure baking.

6. The process of claim 3, further comprising the step (4) of forming a metal plating layer on the second support by electroplating or electroless plating, subsequent to the step (3).

7. A positive resist film laminate comprising a thermoplastic film as a first support and a novolak resin-naphthoquinone diazide (NQD) base positive resist film thereon,
said novolak resin-NQD base positive resist film comprising
(A) a novolak resin-NQD base resin composition,
(B) a polyester, and
(C) 3 to 30% by weight of an organic solvent,
the novolak resin-NQD base resin composition (A) comprising
(A-1) a novolak resin having phenolic hydroxyl groups wherein some or all hydrogen atoms of the phenolic hydroxyl groups are substituted by 1,2-naphthoquinone diazidosulfonyl groups,
(A-2) a novolak resin having phenolic hydroxyl groups wherein some or all hydrogen atoms of the phenolic hydroxyl groups are substituted by 1,2-naphthoquinone diazidosulfonyl groups, and a novolak resin having unsubstituted phenolic hydroxyl groups,
(A-3) a novolak resin having phenolic hydroxyl groups wherein some or all hydrogen atoms of the phenolic hydroxyl groups are substituted by 1,2-naphthoquinone diazidosulfonyl groups, and a 1,2-naphthoquinone diazidosulfonic acid ester,
(A-4) a novolak resin having phenolic hydroxyl groups wherein some or all hydrogen atoms of the phenolic hydroxyl groups are substituted by 1,2-naphthoquinone diazidosulfonyl groups, a novolak resin having unsubstituted phenolic hydroxyl groups, and a 1,2-naphthoquinone diazidosulfonic acid ester, or
(A-5) a novolak resin having unsubstituted phenolic hydroxyl groups and a 1,2-naphthoquinone diazidosulfonic acid ester,
wherein the polyester (B) is alkali soluble.

8. The laminate of claim 1, further comprising (D) a surfactant.

* * * * *